(12) United States Patent
Matsumura et al.

(10) Patent No.: US 6,850,583 B1
(45) Date of Patent: Feb. 1, 2005

(54) CLOCK GENERATION APPARATUS

(75) Inventors: Toshihiro Matsumura, Shiga (JP); Sojiro Ota, Hyogo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 662 days.

(21) Appl. No.: 09/690,476

(22) Filed: Oct. 18, 2000

(30) Foreign Application Priority Data

Oct. 18, 1999 (JP) ............................................ 11-295158

(51) Int. Cl.[7] .............................. H03D 3/24; H04L 7/00; H03L 7/06
(52) U.S. Cl. ......................... 375/376; 375/355; 327/158
(58) Field of Search ................................. 375/355, 376, 375/375; 327/107, 158, 159; 331/1 A

(56) References Cited

U.S. PATENT DOCUMENTS

| | | | |
|---|---|---|---|
| 5,790,613 A | * 8/1998 | Tateishi ....................... | 375/376 |
| 5,805,233 A | 9/1998 | West | |
| 5,811,998 A | * 9/1998 | Lundberg et al. ........... | 327/156 |
| 5,825,825 A | * 10/1998 | Altmann et al. ............. | 375/293 |
| 5,872,819 A | * 2/1999 | Carsello et al. ............. | 375/355 |
| 6,157,690 A | * 12/2000 | Yoneda ....................... | 375/376 |

FOREIGN PATENT DOCUMENTS

| | | | | |
|---|---|---|---|---|
| GB | 2 306 066 | | 4/1997 | |
| GB | 2 306 066 A | * | 4/1997 | ........... H04L/7/033 |

* cited by examiner

*Primary Examiner*—Amanda T. Le
*Assistant Examiner*—Lawrence B. Williams
(74) *Attorney, Agent, or Firm*—Wenderoth, Lind & Ponack, L.L.P.

(57) ABSTRACT

A clock generation apparatus generates a synchronous clock based on an input analog signal. The average of maximum and minimum values of a digital signal in a predetermined period is used as a threshold. Rise and fall times which are times when the threshold and an approximated line of two values of the digital signal crosses are detected. The time intervals between the adjacent rise and fall times are obtained during a predetermined period. The minimum value of the time intervals is used as the input rate. The synchronous clock is output on the basis of the input rate and the rise and fall times. The synchronous clock and a comparison signal which is obtained by comparing the threshold and the digital signal are supplied to a latch circuit, thereby outputting a synchronous signal.

4 Claims, 13 Drawing Sheets

CLOCK GENERATION APPARATUS

FIELD OF THE INVENTION

The present invention relates to a clock generation apparatus and, more particularly, to technology of correctly acquiring VBI data from television signals or the like on which the VBI data are superimposed.

BACKGROUND OF THE INVENTION

FIG. 13 is a block diagram illustrating a semiconductor integrated circuit which constitutes a prior art clock generation apparatus for generating a synchronous clock for a signal which is input at a fixed rate.

As shown in this figure, the semiconductor integrated circuit 1300 constituting the prior art clock generation apparatus comprises an analog input terminal 1301, a threshold input terminal 1302, a synchronous signal output terminal 1303, a synchronous clock output terminal 1304, a comparator circuit 1305, a clock supply circuit 1306, a counter circuit 1307, a decoder circuit 1308, an edge detection circuit 1309 and a D-type flipflop 1310.

The comparator circuit 1305 is a circuit for comparing an analog signal S1301 with the level of a threshold S1302 and outputting the result of the comparison as a binarized signal, i.e., a comparison signal S1305. The comparator circuit 1305 operates using a clock supplied by an oscillator circuit in the clock supply circuit 1306 as the reference clock.

The clock supply circuit 1306 is realized by a crystal oscillator circuit using a crystal or the like. The frequency of the clock which is output by the clock supply circuit is an integral multiple of the rate at which the analog signal S1301 is input. In addition, the edge detection circuit 1309 is a circuit for detecting the edge of the comparison signal S1305 which is output by the comparator circuit 1305. The signal which has been subjected to the edge detection is supplied to the counter circuit 1307.

The counter circuit 1307 operates using the clock signal S1306 from the clock supply circuit 1306 as the reference clock. The count value output by the counter circuit 1307 is supplied to the decoder circuit 1308. The counter circuit 1307 operates using the output from the edge detection circuit 1309 and the output from the decoder circuit 1308 as the clear signals.

Hereinafter, the operation of the digital PLL device will be described.

Initially, the analog signal S1301 and the threshold S1302 are input to the comparator circuit 1305 via the analog input terminal 1301 and the threshold input terminal 1302, respectively.

The comparator circuit 1305 makes the comparison to see whether the level of the analog signal S1301 is larger or smaller than the threshold S1302, and outputs the result of the comparison.

A binarized comparison signal S1305 output by the comparator circuit 1305 is input to the edge detection circuit 1309, and the edge of the comparison signal S1305 is detected herein. The signal whose edge was detected is supplied to the counter circuit 1307 and clears the counter.

Owing to the series of operations of edge detection and counter clear, the count value of the counter circuit 1307 and the edge, i.e., phase of the comparison signal S1305, match.

The count value of the counter circuit 1307 is usually composed of plural bits. Therefore, the decoder circuit 1308 executes decoding so as to output a sample clock signal S1304 and strobe the analog input signal S1301 in an appropriate phase. The D-type flipflop 1310 stably latches the comparison signal S1305 with supply of a sample clock signal S1304 which is output by the decoder circuit 1308.

As described above, in the semiconductor integrated circuit 1300 constituting the prior art clock generation apparatus, a clear signal S1308 for clearing the count value of the counter circuit 1307 decides the frequency division ratio of the counter circuit 1307. The D-type flipflop 1310 stably latches the comparison signal S1305 with the sample clock signal S1304 which is output by the decoder circuit 1308. Therefore, the semiconductor integrated circuit 1300 outputs a synchronous signal and a synchronous clock, which are stable toward the variations in outside environments, such as the variations in temperature or supply voltage and variations with time.

However, in the semiconductor integrated circuit constituting the prior art clock generation apparatus, the frequency of an oscillated clock S1306 which is supplied by the clock supply circuit 1306 is an integral multiple of the input rate of the analog signal S1301, and the variations in the count value of the counter circuit 1307 directly result in the resolution showing the phase of the input analog signal S1301. Therefore, the error in the phase which occurs in the counter circuit 1307 results in the phase error in the case where the signal is captured by the D-type flipflop 1310. In order to solve this problem, the only way is to increase the frequency of the clock supply circuit 1306 to improve the performance. Further, when this is implemented and an extremely high frequency is selected as the frequency of the clock supply circuit 1306, unnecessary radiation is generated from the semiconductor integrated circuit.

Further, in the semiconductor integrated circuit constituting the prior art clock generation apparatus, in the case where the oscillated clock s1306 is not an integral multiple of the input rate of the analog signal S1301, when the input signal S1301 is kept in a certain condition during a period longer than the cycle of the oscillated clock S1306 (for example, when the high level continues), the phase error for the input signal finally exceeds the tolerance and the input signal is erroneously recognized. This results in limiting the frequency of the oscillated clock which is used in the semiconductor integrated circuit comprising the prior art clock generation apparatus. Accordingly, when the input signal has plural kinds of input rates, plural oscillator circuits which correspond to respective input rates are required.

SUMMARY OF THE INVENTION

It is an object of the present invention to provide a clock generation apparatus that generates a synchronous clock on the basis of an input analog signal.

A clock generation apparatus according to a 1st aspect of the present invention comprises: A/D conversion means for converting an input analog signal into a digital signal; arithmetic means for generating a threshold which is used as a reference when the digital signal is binarized to generate a binarized signal and a synchronous clock for sampling the binarized clock, on the basis of the digital signal; binarization means for comparing the digital signal with the threshold generated by the arithmetic means, and outputting a result of the comparison as a binary signal; and latch means for latching the binary signal with the synchronous clock and outputting a synchronous signal, and the arithmetic means comprise threshold detection means for detecting a maximum value and a minimum value of the digital signal in a predetermined period, and outputting an average of the maximum value and the minimum value as the threshold; rise time detection means for detecting a rise time as a time of intersection of the threshold and a line connecting two values of the digital signal, one of which is lower and the other of which is higher than the threshold, when the digital signal changes from the lower value to the higher value; fall time detection means for detecting a fall time as a time of intersection of the threshold and a line connecting two values of the digital signal, one of which is higher and the other of which is lower than the threshold, when the digital signal changes from the higher value to the lower value; input rate detection means for obtaining time intervals between the adjacent rise and the fall times during a predetermined period, and outputting a minimum value of the time intervals as an input rate of the analog signal; and synchronous clock output means for obtaining a half timing of the input rate after an edge of the input analog signal is detected on the basis of the input rate and the rise and fall times and outputting a first one of the synchronous clock at that timing, and obtaining a timing of the input rate after the first synchronous clock is output and outputting a second or later one of the synchronous clock at that timing. Therefore, the input rate is detected from the digital signal which is obtained by subjecting the input analog signal to the A/D conversion, and the synchronous clock is generated on the basis of the input rate. Thereby, when the binarized signal is to be latched, the phase error between the synchronous clock and the binarized signal can be kept within one clock of the synchronous clock. Further, even when the input analog signal has plural kinds of input rates, the plural clock supply circuits are not required.

A clock generation apparatus according to a 2nd aspect of the present invention comprises: A/D conversion means for converting an input analog signal into a digital signal; arithmetic means for generating a threshold which is used as a reference when the digital signal is binarized to generate a binarized signal and a synchronous clock for sampling the binarized clock, on the basis of the digital signal; binarization means for comparing the digital signal with the threshold generated by the arithmetic means, and outputting a result of the comparison as a binary signal; and latch means for latching the binary signal with the synchronous clock and outputting a synchronous signal, and the arithmetic means comprise threshold detection means for detecting integrals of the digital signal in a predetermined period, and outputting an average of the integrals as the threshold; rise time detection means for detecting a rise time as a time of intersection of the threshold and a line connecting two values of the digital signal, one of which is lower and the other of which is higher than the threshold, when the digital signal changes from the lower value to the higher value; fall time detection means for detecting a fall time as a time of intersection of the threshold and a line connecting two values of the digital signal, one of which is higher and the other of which is lower than the threshold, when the digital signal changes from the higher value to the lower value; input rate detection means for obtaining time intervals between the adjacent rise and the fall times during a predetermined period, and outputting a minimum value of the time intervals as an input rate of the analog signal; and synchronous clock output means for obtaining a half timing of the input rate after an edge of the input analog signal is detected on the basis of the input rate and the rise and fall times and outputting a first one of the synchronous clock at that timing, and obtaining a timing of the input rate after the first synchronous clock is output and outputting a second or later one of the synchronous clock at that timing. Therefore, in addition to the effects of the 1st aspect, the clock generation apparatus is hard to be affected by noises or the like in detecting the threshold, thereby detecting the more accurate threshold.

According to 3rd and 4th aspects of the present invention, the clock generation apparatus of the 1st and 2nd aspects, respectively, comprises an oversampling digital filter for interpolating the adjacent digital signals. Therefore, arbitrary frequency characteristics are given to the digital signal, whereby unnecessary signals, such as noises, can be removed. Further, the oversampling increases the number of sample data, whereby the temporal resolution of the digital signal can be increased.

DETAILED DESCRIPTION OF THE PREFERRED EMBODIMENTS

Hereinafter, embodiments of the present invention will be described.

[Embodiment 1]

Figure 1:
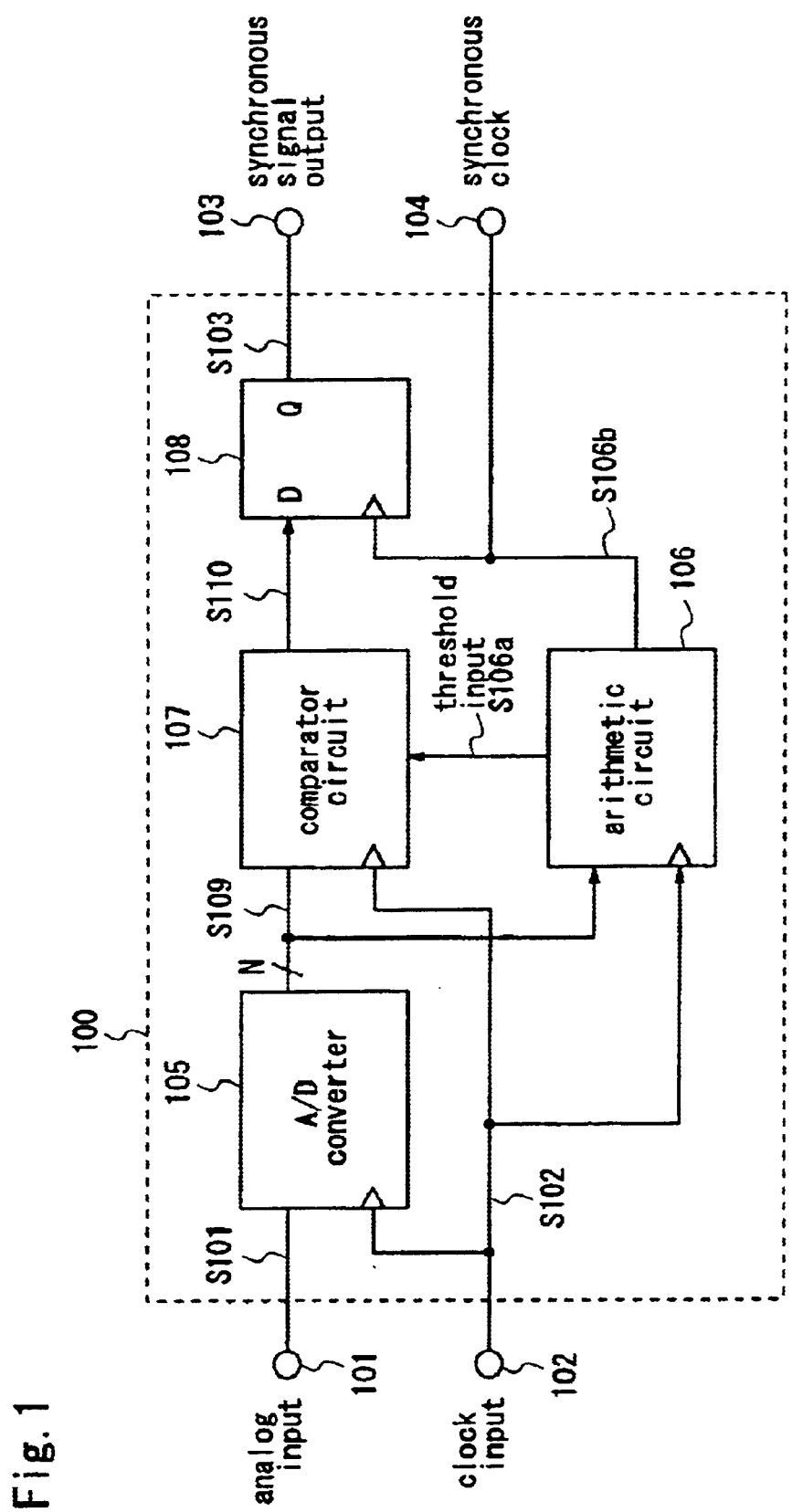
FIG. 1 is a block diagram illustrating a clock generation apparatus according to a first embodiment of the present invention.

FIG. 1 is a block diagram illustrating a clock generation apparatus according to a first embodiment of the present invention.

The clock generation apparatus 100 according to the first embodiment comprises an analog signal input terminal 101, a clock signal input terminal 102, a synchronous signal output terminal 103, a synchronous clock output terminal 104, an A/D converter 105, an arithmetic circuit 106, a comparator circuit 107 and a latch circuit 108. The clock generation apparatus 100 receives an analog signal S101 to which VBI data are superimposed in the blanking interval and a clock signal S102, and outputs a synchronous signal S103 and a synchronous clock S104.

The A/D converter 105 samples the analog signal S101 in accordance with the timing of the clock signal S102, thereby outputting a digital signal S109 as a digital discrete value.

The arithmetic circuit 106 receives the digital signal S109 and the clock signal S102, and outputs a threshold S106a as a reference value for binarizing the digital signal S109 and a synchronous clock S106b for latching a binarized signal S110. The details will be described later.

The comparator circuit 107 receives the digitally converted signal S109 and the threshold S106a, operates in synchronization with the clock signal S102, and makes a comparison to see whether the digital signal S109 is larger or smaller than the threshold S106a. Then, the comparator circuit 107 outputs "1" when the digital signal S109 is larger than the value of the threshold S106a, and outputs "0" when the digital signal S109 is smaller than the threshold S106a, as the binarized signal S110.

The latch circuit 108 receives the binarized signal S110 which is output by the comparator circuit 107 as a D input and the synchronous clock S106b as a clock input, and outputs the synchronous signal S103.

Figure 2:
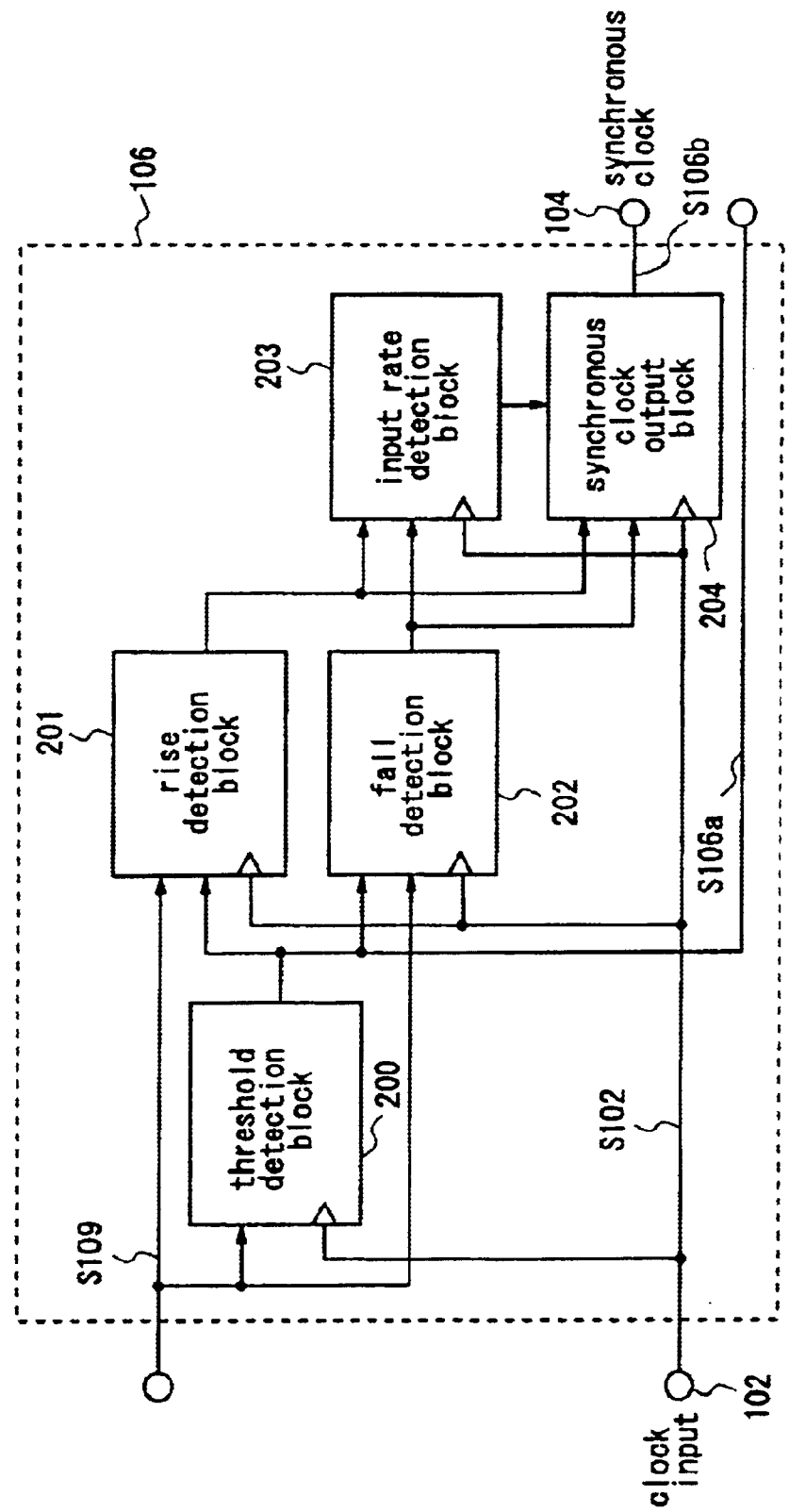
FIG. 2 is a block diagram illustrating an arithmetic circuit in the clock generation apparatus of the first embodiment.

FIG. 2 is a block diagram illustrating the arithmetic circuit in the clock generation apparatus according to the first embodiment.

The arithmetic circuit 106 of the first embodiment comprises a threshold detection block 200 for detecting the threshold S106a, a rise detection block 201 for detecting a rise time as a time of intersection of the threshold S106a and an approximated line of two values of the digital signal S109 when the digital signal S109 exceeds the threshold S106a and, a fall detection block 202 for detecting a fall time as a time of intersection of the threshold S106a and an approximated line of two values of the digital signal S109 when the digital signal S109 is lower than the threshold S106a, an input rate detection block 203 for detecting the rate of the digital signal S109 using the rise time and the fall time, and a synchronous clock output block 204 for outputting the synchronous clock S106b.

Hereinafter, the operation of the clock generation apparatus according to the first embodiment is described.

The analog signal S101 is input to the A/D converter 105 via the analog signal input terminal 101. The clock signal S102 is input to the A/D converter 105, the arithmetic circuit 106 and the comparator circuit 107 via the clock signal input terminal 102.

The A/D converter 105 samples the analog signal S101 in accordance with the timing of the clock signal S102, thereby outputting the digital signal S109 as the digital discrete value to the arithmetic circuit 106 and the comparator circuit 107.

The arithmetic circuit 106 receives the digital signal S109 and the clock signal S102, and outputs the threshold S106a as the reference value for binarizing the digital signal S109 and the synchronous clock S106b for latching the binarized signal S110 in the latch circuit 108. The details will be described later.

The comparator circuit 107 receives the digital signal S109 and the threshold S106a, and makes the comparison to see whether the digital signal S109 is larger or smaller than the threshold S106a in synchronization with the clock signal S102. The comparator circuit 107 outputs "1" when the digital signal S109 is larger than the threshold S106a, and outputs "0" when the digital signal S109 is smaller than the threshold S106a, as the binarized signal S110.

The latch circuit 108 receives the binarized signal S110 as the D input and the synchronous clock S106b as the clock input, and outputs the synchronous signal S103 as the synchronous signal output.

Hereinafter, the operation of the arithmetic circuit 106 outputting the threshold S106a and the synchronous clock S106b is described with reference to FIG. 3.

Figure 3:
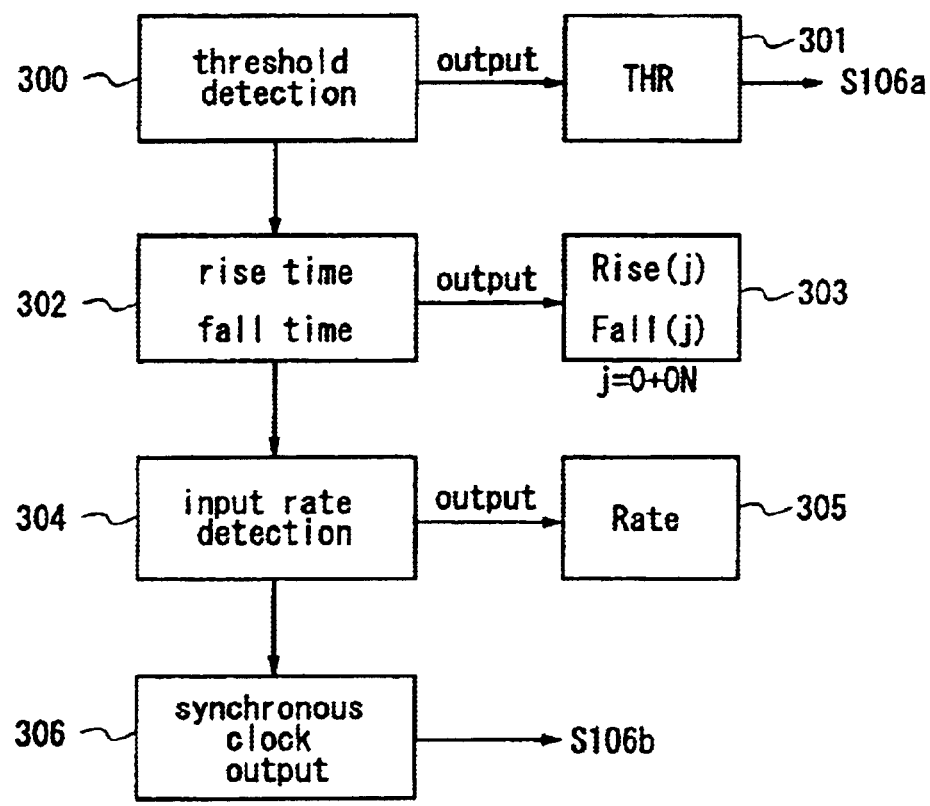
FIG. 3 is a flowchart showing the operation of the arithmetic circuit of the first embodiment.

FIG. 3 is a flowchart showing the operation of the arithmetic circuit of the first embodiment.

Initially, the threshold detection block 200 detects the threshold S106a (Step 300), and outputs the threshold S106a to the rise detection block 201, the fall detection block 202 and the comparator circuit 107 (Step 301). Here, the method for detecting the threshold will be described later.

Next, the rise detection block 201 detects the rise time Rise(j) (Step 302), and outputs the rise time Rise(j) to the input rate detection block 203 and the synchronous clock output block 204 (Step 303). Similarly, the fall detection block 202 detects the fall time Fall(j), and outputs the fall time Fall(j) to the input rate detection block 203 and the synchronous clock output block 204. Here, "j" is the argument and shows the order in which the respective times have been detected. The rise time detection method and the fall time detection method will be described later.

Then, the input rate detection block 203 detects a rate (Rate) of the digital signal S109 on the basis of the rise time Rise(j) and the fall time Fall(j) (Step 304), and outputs the rate (Rate) to the synchronous clock output block 204 (Step 305). The method for detecting the input rate will be described later.

Then, the synchronous clock output block 204 outputs the synchronous clock S106b (Step 306). The method for outputting the synchronous clock will be described later.

Hereinafter, the operations in the respective blocks of the arithmetic circuit 106 are described in detail with reference to FIGS. 4 to 9.

Initially, a threshold detection method in the threshold detection block 200 is described with reference to the flowchart of FIG. 4.

Figure 4:
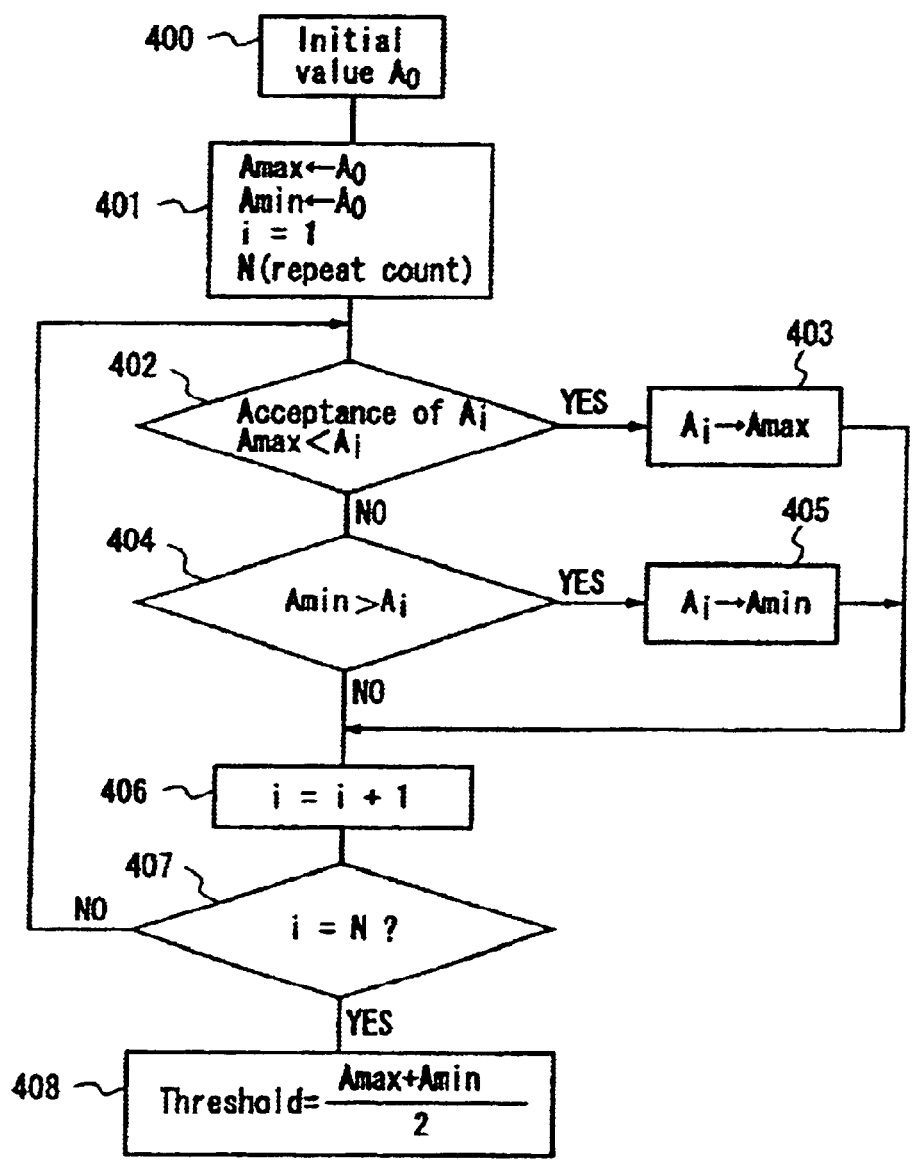
FIG. 4 is a flowchart showing a threshold detection method according to the first embodiment.

FIG. 4 is a flowchart showing the threshold detection method according to the first embodiment.

Initially, the digital signal S109 as the output of the A/D converter 105 is accepted at an arbitrary time as 0th data $A_0$, and the data $A_0$ is set as the initial value (Step 400). The data $A_0$ is input to internal registers Amax and Amin in the arithmetic circuit 106, respectively, and "1" is input to the internal pointer i as well as a repeat count N is given (Step 401). The repeat count N shows the number of the digital signals S109. The larger the number, the more the accuracy of the threshold S106a is increased.

Then, the digital signals S109 are accepted in the order pointed by the internal pointer i, and the comparison is made to see whether the accepted data $A_i$ is larger or smaller than the data in the internal register Amax (Step 402). When the data $A_i$ is larger than the data in the internal register Amax, the data in the internal register Amax is replaced with the data $A_i$ (Step 403). On the other hand, when data $_{Ai}$ is smaller than the data in the internal register Amax, a comparison is made to see whether the data $A_i$ is larger or smaller than the data in the internal register Amin (Step 404). When the data Ai is smaller than the data in the internal register Amin, the data in the internal register Amin is replaced with the data $A_i$ (Step 405).

Thereafter, the internal pointer i is incremented (Step 406) and whether or not the value of the internal pointer i is equal to the repeat count N is checked (Step 407). When the value of the internal pointer i is not equal to the repeat count N, i.e., the value of the internal pointer i is smaller than the repeat count N, the processing proceeds to Step 402 so as to accept the next digital signal S109. When the value of the internal pointer i is equal to the repeat count N, the average value of the data in the internal register Amax and the data in the internal register Amin is output as the threshold S106a (Step 408).

A rise time detection method in the rise detection block 201 is described with reference to the flowchart of FIG. 5.

Figure 5:
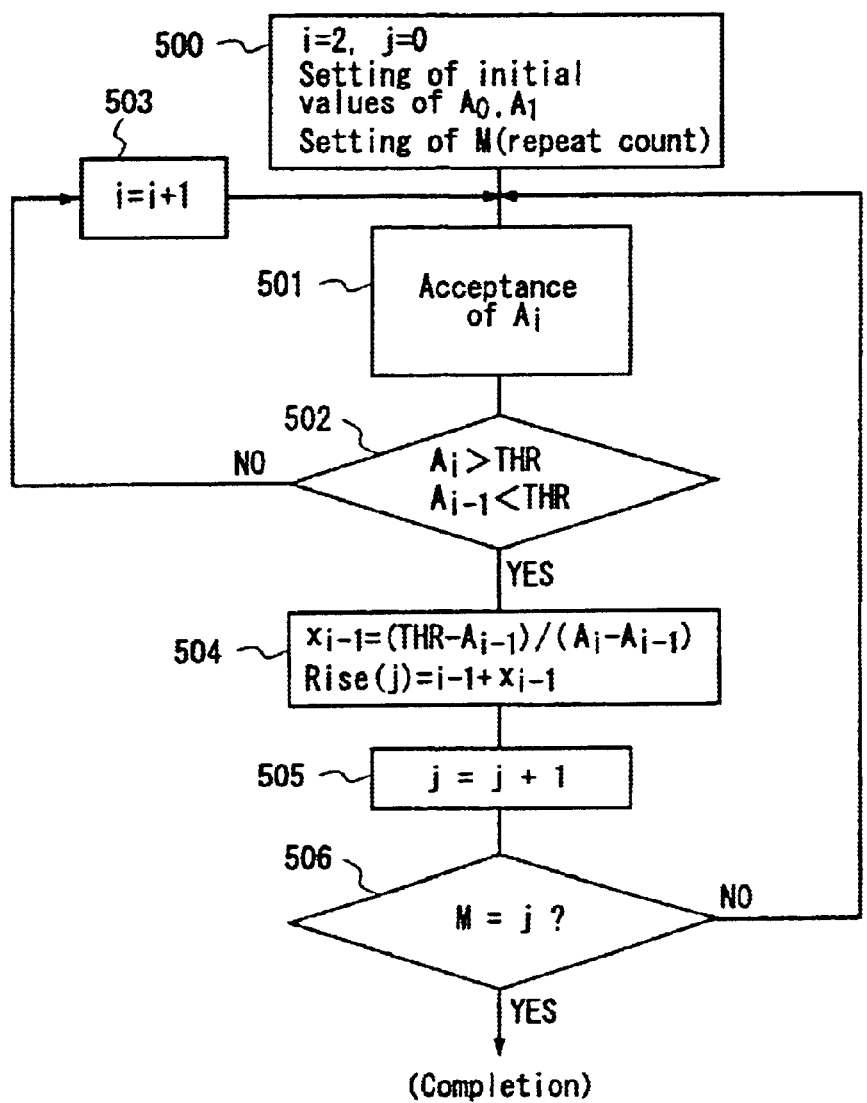
FIG. 5 is a flowchart showing a rise time detection method according to the first embodiment.

FIG. 5 is a flowchart showing the rise time detection method according to the first embodiment.

Initially, "2" is input to the internal pointer i, and further, the internal pointer j is cleared. Then, the digital signal S109 which is accepted at an arbitrary time is set as data $A_0$, the digital signal S109 which is accepted subsequent to the data $A_0$ is set as data $A_1$, and the input of the repeat count M is accepted (Step 500).

Further, the digital signal S109 is accepted (Step 501) When Step 501 is executed for the first time at this time, the digital signal S109 which is accepted here is data $A_2$, because "2" has already been set in the internal pointer i.

Then, it is determined whether the value of data $A_{i-1}$ is smaller than the threshold S106a and the value of data $A_i$ is larger than the threshold S106a (Step 502). When the value of the data Ai−1 is larger than the threshold S106a or the value of the data Ai is smaller than the threshold S106a, the internal pointer i is incremented and then Step 501 is executed (Step 503). When the value of the data Ai−1 is smaller than the threshold S106a and the value of the data Ai is larger than the threshold S106a, the analog signal S101 intersects the threshold S106a and the rise time occurs. Therefore, the j-th rise time Rise(j) is output (Step 504). The details of this arithmetic will be described later.

Then, the internal pointer j is incremented (Step 505) and whether or not M pieces of the rise time Rise(j) have been detected is monitored (Step 506). When M pieces of the rise time have been detected, the processing is completed. Otherwise, the processing returns to Step 501 and the above-mentioned processing is repeated until M pieces of the rise time are detected.

Figure 6:
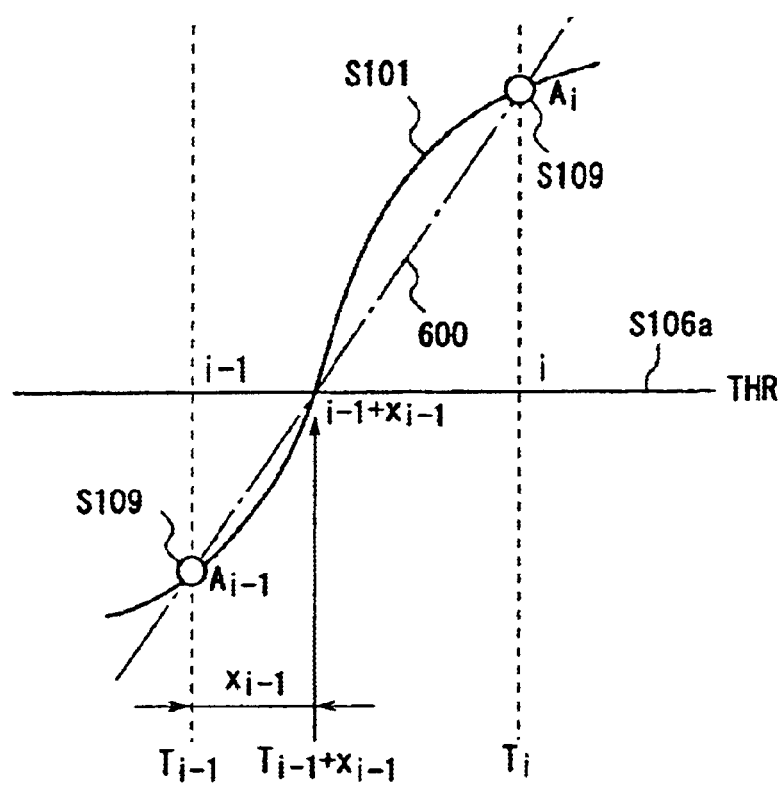
FIG. 6 is a timing chart for explaining the rise time detection method of the first embodiment.

Here, the details of the method of obtaining the j-th rise time Rise(j) are given with reference to FIG. 6.

FIG. 6 is a timing chart for explaining the rise time detection method of the first embodiment.

At time $T_{i-1}$, the data $A_{i-1}$, of the digital signal S109 as the output of the A/D converter 105 is accepted, and the value of the data is lower than the threshold S106a. At time $T_i$, the data $A_i$ of the digital signal S109 is accepted. This data $A_i$ is higher than the threshold S106a. Therefore, the analog signal S101 intersects the threshold S106a between time $T_{i-1}$ and time $T_i$.

The dot-dash line 600 shows a straight line which is obtained by linear approximation with the two points of the data. Making the approximation that a time when the analog signal S101 intersects the threshold S106a is a time when the dot-dash line 600 intersects the threshold S106a, that time is a time when a period $x_{i-1}$, has elapsed from time $T_{-1}$. That is, the dot-dash line 600 is an intersection time approximation line and $x_{i-1}$, is a rise intersection time correction time.

Assuming that the origin of the time axis of the dot-dash line 600 is a time when the data Ai−1 is input, the parameter of the time axis is x, and the amplitude axis of the input signal is y, their relationship is given by the following equation:

$$y = A_{i-1} + (A_i - A_{i-1})x$$

The time $X_{i-1}$ when the dot-dash line 600 intersects the threshold S106a is given by the following equation assuming that the threshold is THR, $$THR = A_{i-1} + (A_i - A_{i-1})x_{i-1}$$

Therefore, when this linear equation is solved to obtain $x_{i-1}$, $$x_{i-1} = (THR - A_{i-1})/(A_i - A_{i-1})$$

This $x_{i-1}$ corresponds to the decimal part of the rise time Rise(j). Therefore, the rise time Rise(j) obtained in Step 504 is given by the following expression.

$$\text{Rise}(j) = i - x_{i-1}$$

A fall time detection method in the fall detection block 202 is described with reference to FIG. 7.

Figure 7:
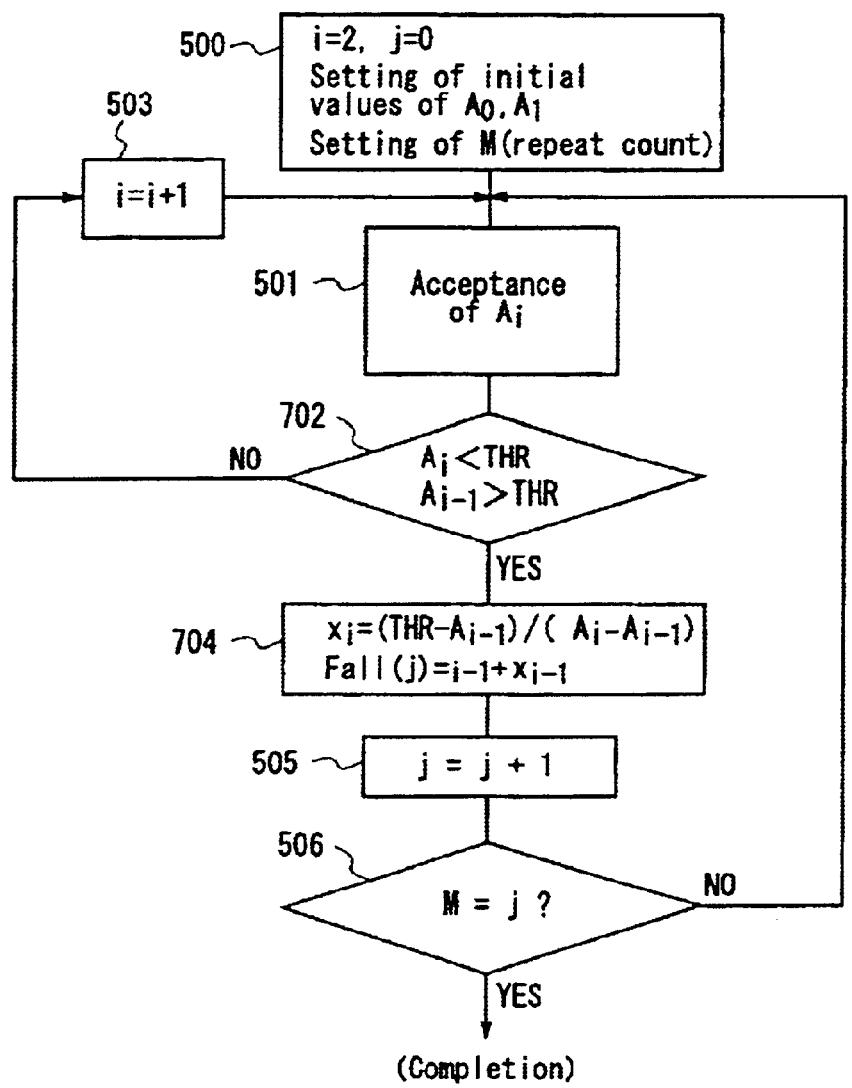
FIG. 7 is a flowchart showing a fall time detection method according to the first embodiment.

FIG. 7 is a flowchart showing the fall time detection method according to the first embodiment.

In FIG. 7, the same reference numerals as those in FIG. 5 correspond to the same processes in FIG. 5.

In the fall time detection method as shown in the flowchart of FIG. 7, whether or not the analog signal became lower than the threshold is detected in Step 702. Therefore, the determination is made by a criterion opposed to that in Step 502. The fall time detection method is different from Steps 502 and 504 of the rise time detection method in that it is determined whether the value of the data $A_{i-1}$ is larger than the threshold S106a and the value of the data $A_i$ is smaller than the threshold S106a, and that an arithmetic result in Step 704 is output as Fall (j), respectively.

An input rate detection method in the input rate detection block 203 is described with reference to the flowchart of FIG. 8.

The input rate of the input analog signal S101 can be detected on the basis of the rise time and fall time which are detected by the above-mentioned processing. That is, when the period from a rise time Rise(j) to a fall time Fall(j) occurring subsequently is obtained, this period is always a multiple of the input rate. Therefore, difference values between plural rise times and fall times are obtained, and the minimum value of the difference values is used as the input rate.

Figure 8:
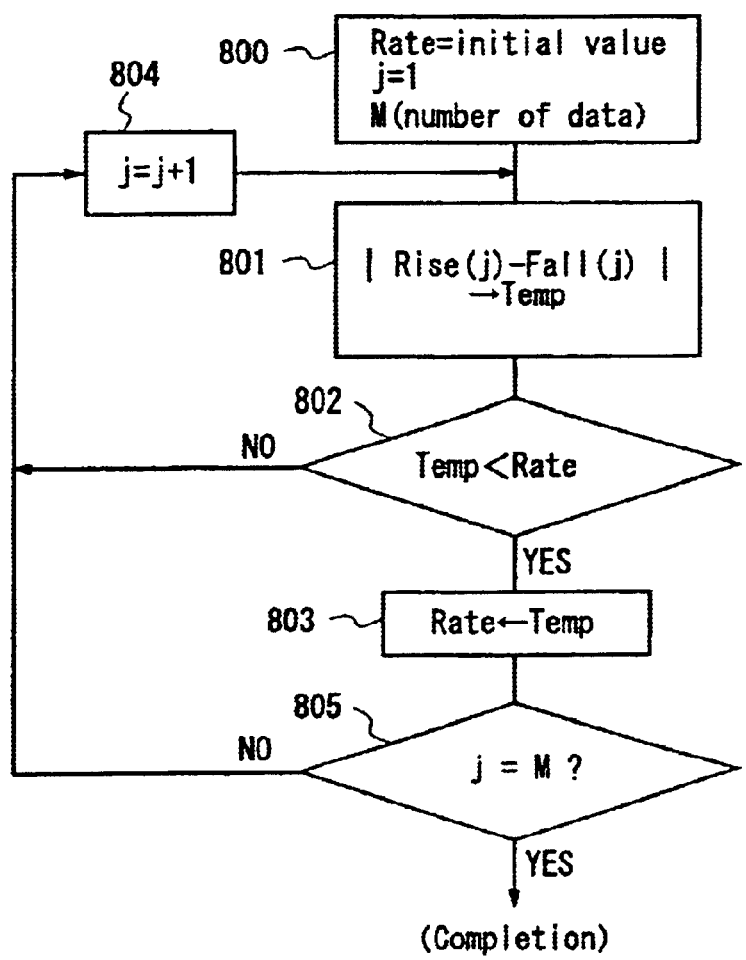
FIG. 8 is a flowchart showing an input rate detection method according to the first embodiment.

FIG. 8 is a flowchart showing the input rate detection method according to the first embodiment.

Initially, an initial value is input to the internal register Rate which holds the input rate of the input signal, the initial value "1" is input to the internal pointer j, and the repeat count M is set (Step 800). In this case, M means the number of data of a plurality of the rise times Rise and the fall times Fall obtained in Step 302.

Next, the time interval between the rise time Rise(j) and the fall time Fall(j) is obtained, and the result is retained in the internal register Temp (Step 801). The internal register Temp is a saving register to which the difference between the rise time Rise(j) and the fall time Fall(j) corresponding to the argument provided for convenience of arithmetic is saved.

Then, the value of the internal register Rate is compared with the value of the internal register Temp (Step 802). When the value of the internal register Temp is smaller than the value of the internal register Rate, the value of the internal register Temp is input to the internal register Rate to make a replacement of the value (Step 803). When the value of the internal register Temp is larger than the value of the internal register Rate, the internal pointer j is incremented and Step 801 is executed again (Step 804).

Then, in Step 805, when the value of the internal pointer j is equal to the repeat count M, i.e., when the prescribed number of times of processing has been completed, the processing is completed. The value of the internal register Rate at this time is used as the input rate. When the prescribed number of times of processing has not been completed, Step 804 is executed.

A method for outputting the synchronous clock in the synchronous clock output block 204 is described with reference to the flowchart of FIG. 9.

Figure 9:
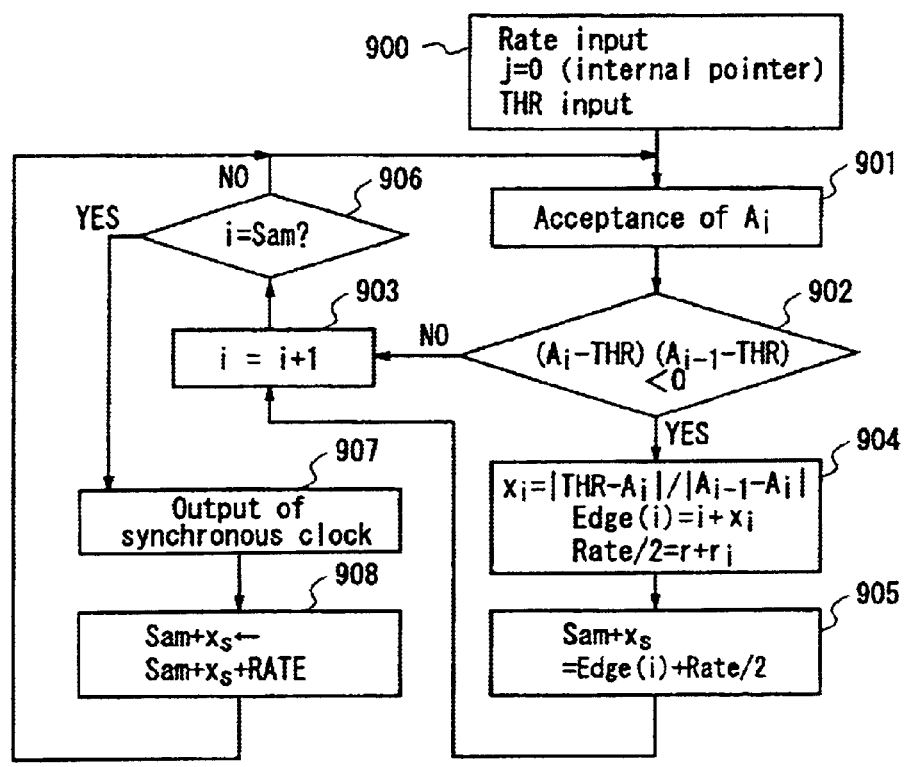
FIG. 9 is a flowchart showing a synchronous clock output method according to the first embodiment.

FIG. 9 is a flowchart showing a synchronous clock output method according to the first embodiment.

Initially, the threshold S106*a* detected in Step 300 and the input rate (Rate) detected in Step 305 are accepted, and further, the internal pointer i is cleared (Step 900).

Next, the digital signals S109 are accepted in the order in which the internal pointer i points the signals. The product of the difference between the accepted data $A_i$ and the threshold S106*a* and the difference between the previously accepted data $A_{i-1}$ and the threshold S106*a* is obtained (Step 902). When the product is 0 or more, the internal pointer i is incremented (Step 903). When the product is less than 0, $x_i$ and the edge time Edge(i) as a time when the data intersects the threshold S106*a* are obtained on the same principles in Steps 504 and 704 (Step 904). The obtained Edge(i) is composed of an integer part i and a decimal part $X_i$. In addition, Rate/2 is composed of an integer part r and a decimal part $r_j$. The Edge(i) and Rate/2 are added and consequently an integer part Sam and a decimal part $x_s$ are obtained (Step 905). Owing to the arithmetic in this Step, the first synchronous clock S106*b* is generated at a half timing of the input rate (Rate), i.e., at the middle of one rate of the input signal, after the edge of the signal comes.

Next, it is monitored that the Sam-th data Asam for generating the synchronous clock S106*b* is input (Step 906) When it is detected that the data Asam has been input, the synchronous clock S106*b* is generated once (Step 907).

Then, the arithmetic for a timing value of the second or subsequent synchronous clock is performed (Step 908). The timing for generating the synchronous clock in the middle of the input rate, i.e., Sam+$x_s$ has been already obtained in Step 905 when the first synchronous clock is generated. Therefore, in this Step, only the value of the internal register Rate is added to Sam+Xs, whereby the second or subsequent clock can be generated in the middle of the input rate. Thereafter, the above-mentioned processing is repeated, thereby outputting the synchronous clock S106*b*.

In the clock generation apparatus according to the first embodiment, the input rate is detected from the digital signal which is obtained by subjecting the input analog signal to the A/D conversion, and the synchronous clock is generated on the basis of the input rate. Therefore, when the binarized signal is to be latched, the phase error between the synchronous clock and the binarized signal can be within one clock of the synchronous clock. Accordingly, the VBI data can be correctly acquired from analog television signals on which the VBI data are superimposed in the blanking interval.

In addition, the clock generation apparatus of the first embodiment, is usually realized by a semiconductor integrated circuit while, in this case, in order to improve performance of the clock generation apparatus, it is not required to increase the frequency of the supplied clock. Therefore, the unnecessary radiation generated from the semiconductor integrated circuit is not increased. Furthermore, even when the input analog signal has the plural kinds of input rates, the plural clock supply circuits are not required.

[Embodiment 2]

Figure 10:
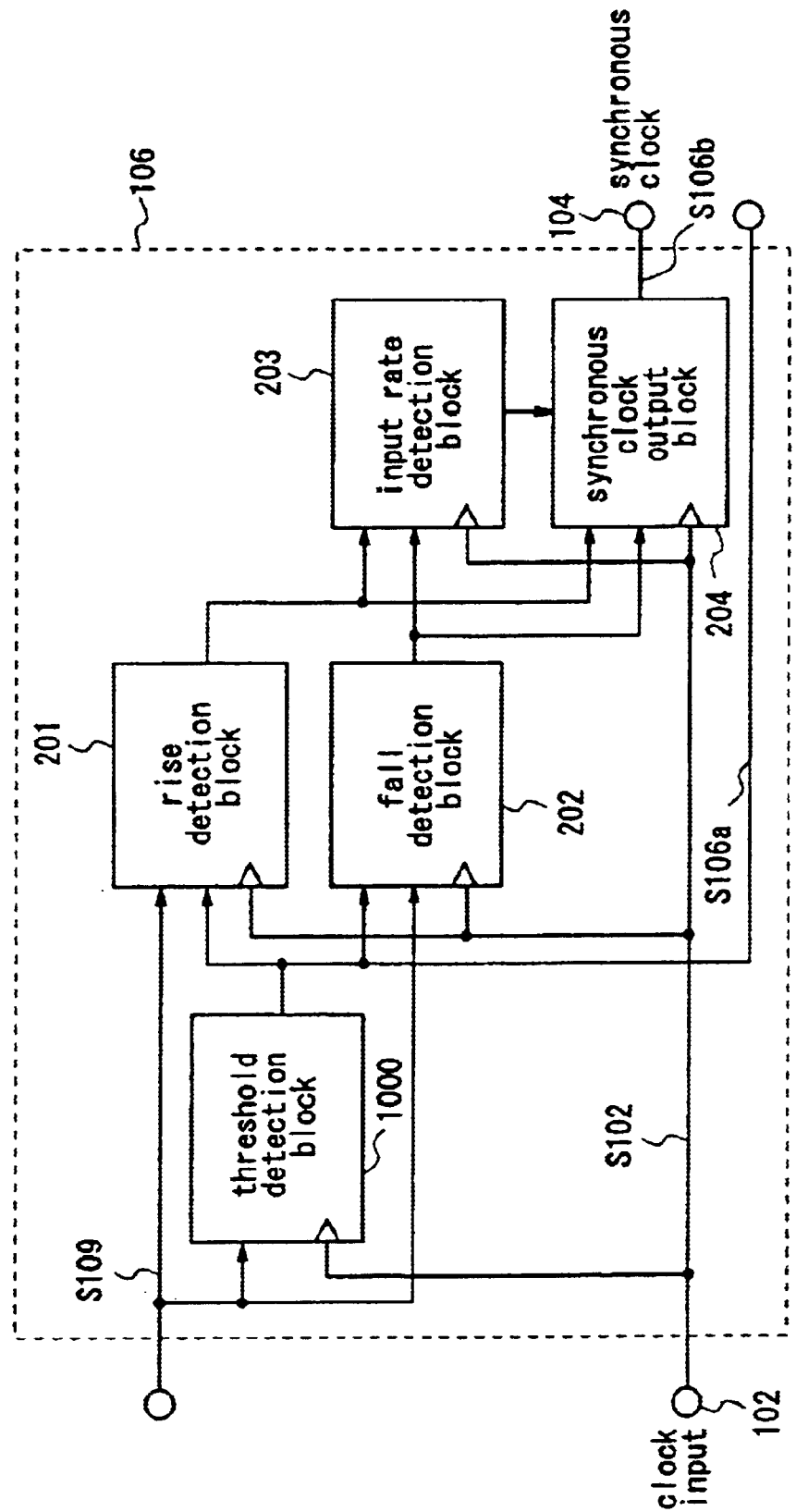
FIG. 10 is a block diagram illustrating an arithmetic circuit in a clock generation apparatus according to a second embodiment of the present invention.

FIG. 10 is a block diagram illustrating an arithmetic circuit of a clock generation apparatus according to a second embodiment of the present invention.

In the clock generation apparatus according to the second embodiment, the arithmetic circuit 106 in the clock generation apparatus of the first embodiment as shown in FIG. 1 is replaced with an arithmetic circuit as shown in FIG. 10. Other construction is the same as that in the clock generation apparatus according to the first embodiment.

As shown in FIG. 10, the arithmetic circuit 106 comprises a threshold detection block 1000 for detecting a threshold S106*a*, a rise detection block 201 for detecting a rise time as a time of intersection of the threshold S106*a* and an approximated line of two values of the digital signal S109 when the digital signal S109 exceeds the threshold S106*a*, a fall detection block 202 for detecting a fall time as a time of intersection of the threshold S106*a* and an approximated line of two values of the digital signal S109 when the digital signal S109 gets lower than the threshold S106*a*, an input rate detection block 203 for detecting a rate of the digital signal S109 using the rise time and the fall time, and a synchronous clock output block 204 for outputting a synchronous clock S106*b*.

Hereinafter, the operation is described.

Here, the operations of the rise detection block 201, the fall detection block 202, the input rate detection block 203 and the synchronous clock output block 204 are the same as those in the first embodiment. Therefore, their descriptions are not given here. Hereinafter, the description is given of the operation of the threshold detection block 1000 detecting the threshold S106*a*, with reference to FIG. 11.

Figure 11:
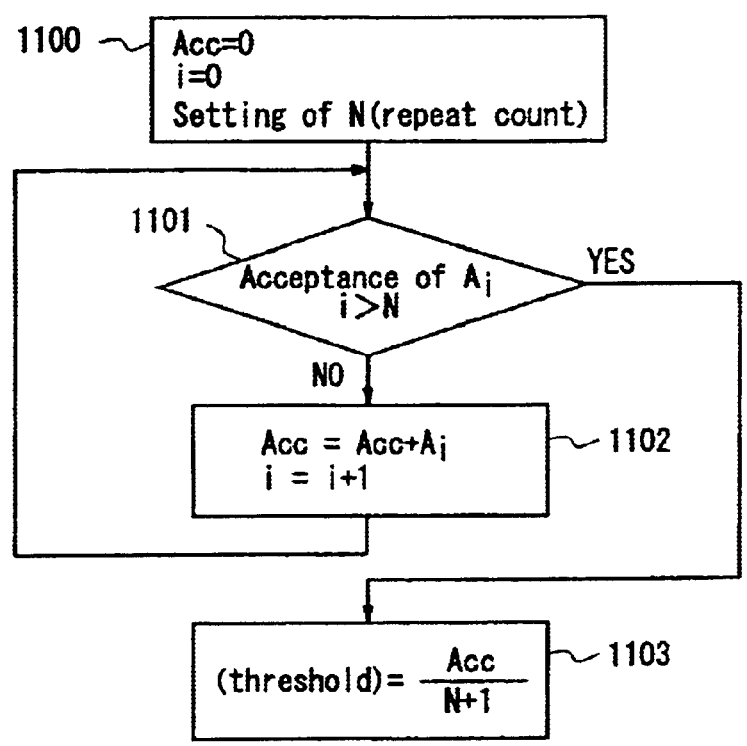
FIG. 11 is a flowchart showing a threshold detection method according to the second embodiment.

FIG. 11 is a flowchart showing a threshold detection method according to the second embodiment.

Initially, an internal register Acc and an internal pointer i in the arithmetic circuit 106 are cleared, respectively, and a repeat count N is accepted (Step 1100). Here, the repeat count N shows the number of the digital signals S109. The larger the number, the more the accuracy of the threshold S106*a* is increased.

Next, the digital signal S109 is accepted as well as it is monitored whether the value of the internal pointer i is larger than the repeat count N (Step 1101). When the value of the internal pointer i is smaller than the repeat count N, data Ai which has been accepted in Step 1101 is successively added to the internal register Acc, and further the internal pointer i is incremented (Step 1102). Accordingly, the integral of data $A_i$ of (N+1) digital signals S109 (i.e., data $A_i$ of the digital signal S109 where i=0, i.e., 0-th data, to data $A_i$ of the digital signal S109 where i=N, i.e., N-th data) is stored in the internal register Acc. In addition, when the value of the internal pointer i is larger than the repeat count N, the value of the internal register Acc is divided by the number of the integrated data, i.e., N+1. Then, the obtained value is output as the threshold S106*a* (Step 1103).

In the clock generation apparatus according to the second embodiment, the average of the integrals of the digital signals is used as the threshold. Therefore, the effects of the clock generation apparatus according to the first embodiment are obtained, and further effects that the detection of the threshold resists influences by the noises or the like and a more accurate threshold is detected are obtained.

[Embodiment 3]

Figure 12:
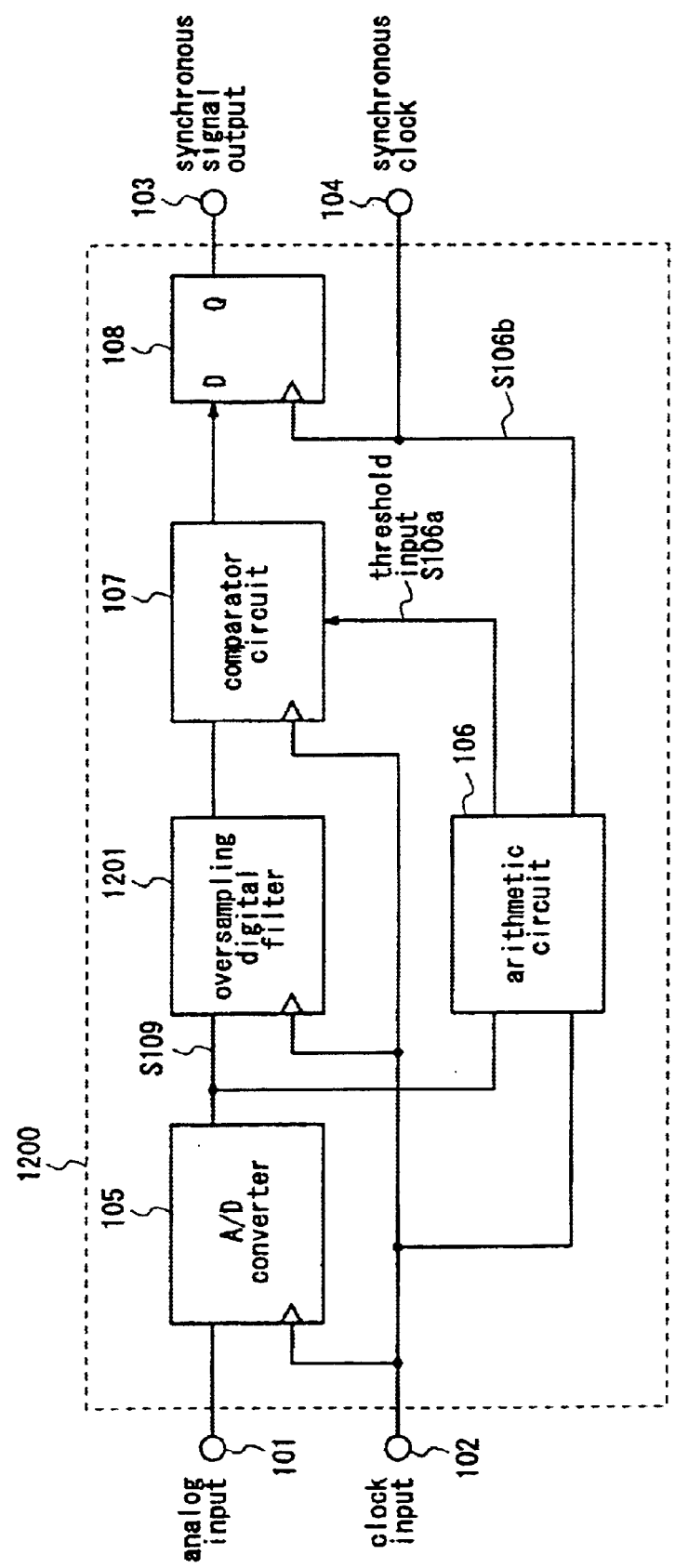
FIG. 12 is a block diagram illustrating a clock generation apparatus according to a third embodiment of the present invention.
Figure 13:
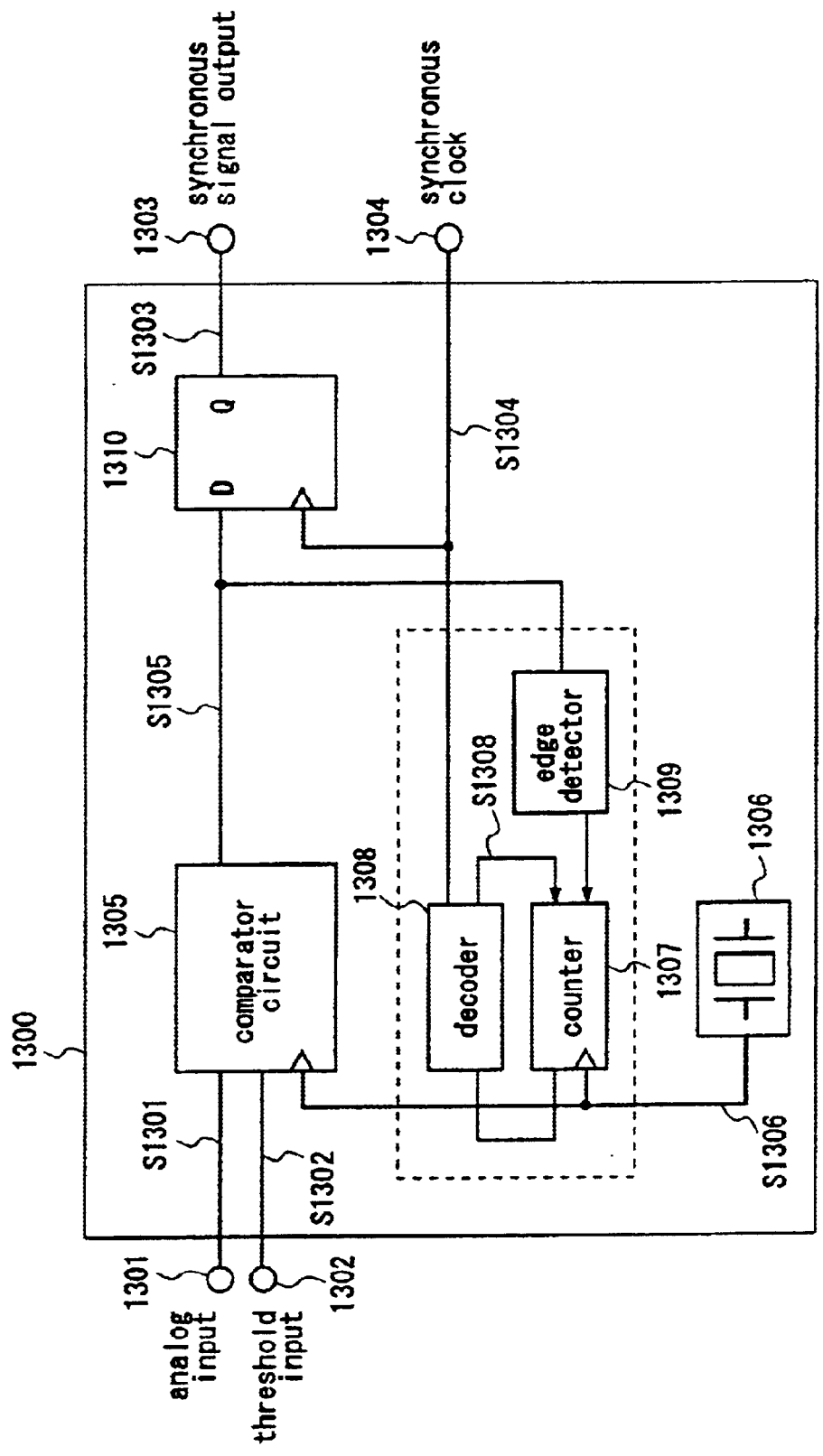
FIG. 13 is a block diagram illustrating a semiconductor integrated circuit comprising a prior art clock generation apparatus.

FIG. 12 is a block diagram illustrating a clock generation apparatus according to a third embodiment of the present invention. In this figure, the same reference numerals as those in FIG. 1 denote the same or corresponding parts, and their descriptions are not given here.

The clock generation apparatus according to the third embodiment comprises an oversampling digital filter 1201 in the subsequent stage of the A/D converter 105 of the clock generation apparatus according to the first embodiment.

The oversampling digital filter 1201 gives an arbitrary frequency characteristic to the input signal as well as performs oversampling and outputs the oversampled signal to the comparator circuit 107.

In the clock generation apparatus according to the third embodiment, the oversampling digital filter 1201 gives an arbitrary frequency characteristic to the digital signal, whereby unnecessary signals, such as noises, can be removed. Further, the oversampling digital filter performs the oversampling, whereby the number of sample data is increased and the temporal resolution of the digital signal can be increased.

The clock generation apparatus of the third embodiment comprises the oversampling digital filter in the subsequent stage of the A/D converter in the clock generation apparatus of the first embodiment. However, the oversampling digital filter can be provided in the subsequent stage of the A/D converter in the clock generation apparatus of the second embodiment.

In the first to third embodiments, the clock generation apparatus according to the present invention are described taking cases where television signals to which VBI data are superimposed in the blanking interval are input as examples. However, the signals are not restricted to the television signal, and playback signals of CD (Compact Disk) or MD (mini disk) or the like can be input.

What is claimed is:

1. A clock generation apparatus comprising:

A/D conversion means for converting an input analog signal into a digital signal;

arithmetic means for generating a threshold used as a reference when binarizing the digital signal to generate a binary signal and a synchronous clock for sampling the binary signal, on the basis of the digital signal;

binarization means for comparing the digital signal with the threshold generated by the arithmetic means, and outputting a result of the comparison as the binary signal; and latch means for latching the binary signal with the synchronous clock and outputting a synchronous signal, wherein the arithmetic means comprises:

threshold detection means for detecting a maximum value and a minimum value of the digital signal in a predetermined period, and outputting an average of the maximum value and the minimum value as the threshold;

rise time detection means for detecting a rise time as a time of intersection of the threshold and a line connecting two values of the digital signal, one of the two values being lower that the threshold and another of the two values being higher than the threshold, when the digital signal changes from the lower value to the higher value;

fall time detection means for detecting a fall time as a time of intersection of the threshold and a line connecting two values of the digital signal, one of the two values being higher than the threshold and another of the two values being lower than the threshold, when the digital signal changes from the higher value to the lower value;

input rate detection means for obtaining time intervals between adjacent rise and fall times during a predetermined period, and outputting a minimum value of the time intervals as an input rate of the input analog signal; and synchronous clock output means for obtaining a half timing of the input rate after an edge of the input analog signal is detected on the basis of the input rate and the rise and fall times and outputting a first one of the synchronous clock at that timing, and obtaining a timing of the input rate after the first synchronous clock is output and outputting a second or later one of the synchronous clock at that timing.

2. A clock generation apparatus comprising:

A/D conversion means for converting an input analog signal into a digital signal;

arithmetic means for generating a threshold used as a reference when binarizing the digital signal to generate a binary signal and a synchronous clock for sampling the binary signal, on the basis of the digital signal;

binarization means for comparing the digital signal with the threshold generated by the arithmetic means, and outputting a result of the comparison as the binary signal; and latch means for latching the binary signal with the synchronous clock and outputting a synchronous signal; wherein the arithmetic means comprises:

threshold detection means for detecting integrals of the digital signal in a predetermined period, and outputting an average of the integrals as the threshold;

rise time detection means for detecting a rise time as a time of intersection of the threshold and a line connecting two values of the digital signal, one of the two values being lower than the threshold and another of the two values being higher than the threshold, when the digital signal changes from the lower value to the higher value;

fall time detection means for detecting a fall time as a time of intersection of the threshold and a line connecting two values of the digital signal, one of the two values being higher than the threshold and another of the two values being lower than the threshold, when the digital signal changes from the higher value to the lower value;

input rate detection means for obtaining time intervals between adjacent rise and fall times during a predetermined period, and outputting a minimum value of the time intervals as an input rate of the input analog signal; and synchronous clock output means for obtaining a half timing of the input rate after an edge of the input analog signal is detected on the basis of the input rate and the rise and fall times and outputting a first one of the synchronous clock at that timing, and obtaining a timing of the input rate after the first synchronous clock is output and outputting a second or later one of the synchronous clock at that timing.

3. The clock generation apparatus of claim 1, further comprising:

an oversampling digital filter for interpolating adjacent digital signals.

4. The clock generation apparatus of claim 2, further comprising:

an oversampling digital filter for interpolating adjacent digital signals.

* * * * *